United States Patent
Fisher et al.

(10) Patent No.: US 7,446,612 B2
(45) Date of Patent: Nov. 4, 2008

(54) AMPLIFIER FEEDBACK AND BIAS CONFIGURATION

(75) Inventors: Robert Michael Fisher, Center Point, IA (US); Michael L. Hageman, Mount Vernon, IA (US)

(73) Assignee: Skyworks Solutions, Inc., Irvine, CA (US)

( * ) Notice: Subject to any disclaimer, the term of this patent is extended or adjusted under 35 U.S.C. 154(b) by 178 days.

(21) Appl. No.: 11/518,109

(22) Filed: Sep. 8, 2006

(65) Prior Publication Data

US 2008/0061884 A1  Mar. 13, 2008

(51) Int. Cl.
  *H03F 1/30* (2006.01)
(52) U.S. Cl. .................... 330/290; 330/296; 330/291
(58) Field of Classification Search .................. 330/290, 330/296, 291
  See application file for complete search history.

(56) References Cited

U.S. PATENT DOCUMENTS

| | | | |
|---|---|---|---|
| 3,470,472 A | 9/1969 | Suzuki | |
| 3,706,933 A | 12/1972 | Bidell et al. | |
| 4,068,159 A | 1/1978 | Gyugyi | |
| 4,137,776 A | 2/1979 | Rudis et al. | |
| 4,162,452 A | 7/1979 | Ash | |
| 4,245,165 A | 1/1981 | Hoffman | |
| 4,292,596 A | 9/1981 | Ishizuka et al. | |
| 4,501,018 A | 2/1985 | Shanley | |
| 4,596,143 A | 6/1986 | Norel | |
| 4,641,048 A | 2/1987 | Pollock | |
| 4,866,314 A | 9/1989 | Traa | |
| 4,885,550 A | 12/1989 | Ferrer | |
| 4,980,586 A | 12/1990 | Sullivan et al. | |
| 5,047,664 A | 9/1991 | Moyal | |
| 5,166,959 A | 11/1992 | Chu et al. | |
| 5,264,745 A | 11/1993 | Woo | |
| 5,321,851 A | 6/1994 | Sugayama et al. | |
| 5,327,131 A | 7/1994 | Ueno et al. | |

(Continued)

FOREIGN PATENT DOCUMENTS

EP  0597653  5/1994

(Continued)

OTHER PUBLICATIONS

Sedra, Adel S., et al. Microelectronic Circuits, Hot Rine-Hart and Winston, p. 262 (ISBN 0-03-007328-6), 1987.

(Continued)

*Primary Examiner*—Patricia Nguyen
(74) *Attorney, Agent, or Firm*—Weide & Miller, Ltd.

(57) ABSTRACT

A wireless communication device output amplifier configured to reduce or eliminate out of band oscillations from voltage standing waves generated by antenna impedance mismatch reflection. The amplifier is configured with an input, output, and biasing node. The biasing node is configured to receive a biasing signal from a biasing amplifier. The biasing amplifier draws current from the biasing node while providing the biasing voltage to the output amplifier. To reduce or eliminate out of band voltage standing waves from antenna reflections, a frequency dependant network is provided as a feedback loop to selectively provide feedback to the output amplifier to reduce or eliminate unwanted out of band oscillations, such as voltage standing waves. The frequency dependant network may comprise one or more resistors, inductors, and capacitors which are of small size and may be integrated.

25 Claims, 4 Drawing Sheets

U.S. PATENT DOCUMENTS

| | | | |
|---|---|---|---|
| 5,438,259 A | 8/1995 | Orihashi et al. | |
| 5,444,863 A | 8/1995 | Torii | |
| 5,450,030 A | 9/1995 | Shin et al. | |
| 5,450,044 A | 9/1995 | Hulick | |
| 5,457,719 A | 10/1995 | Guo et al. | |
| 5,553,319 A | 9/1996 | Tanbakuchi | |
| 5,578,943 A | 11/1996 | Sasaki | |
| 5,578,944 A | 11/1996 | Saski | |
| 5,596,600 A | 1/1997 | Dimos et al. | |
| 5,631,601 A | 5/1997 | Horsfall et al. | |
| 5,648,985 A | 7/1997 | Bjerede et al. | |
| 5,701,594 A | 12/1997 | Bath | |
| 5,859,869 A | 1/1999 | Sanderford | |
| 5,942,938 A | 8/1999 | Myers | |
| 6,101,224 A | 8/2000 | Lindoffi | |
| 6,121,758 A | 9/2000 | Bellina et al. | |
| 6,130,579 A | 10/2000 | Iyer et al. | |
| 6,172,567 B1 | 1/2001 | Ueno et al. | |
| 6,194,963 B1 | 2/2001 | Camp | |
| 6,204,650 B1 | 3/2001 | Shimamori | |
| 6,222,878 B1 | 4/2001 | McCallister et al. | |
| 6,233,440 B1 | 5/2001 | Taylor | |
| 6,300,837 B1 * | 10/2001 | Sowlati et al. | 330/296 |
| 6,333,677 B1 | 12/2001 | Dening | |
| 6,421,398 B1 | 7/2002 | McVey | |
| 6,445,247 B1 | 9/2002 | Walker | |
| 6,492,874 B1 * | 12/2002 | Shih | 330/288 |
| 6,492,875 B2 | 12/2002 | Luo et al. | |
| 6,496,061 B1 | 12/2002 | Bloom et al. | |
| 6,510,309 B1 | 1/2003 | Thompson et al. | |
| 6,515,546 B2 * | 2/2003 | Liwinski | 330/296 |
| 6,535,735 B2 | 3/2003 | Underbrink et al. | |
| 6,651,021 B2 | 11/2003 | Underbrink et al. | |
| 6,681,101 B1 | 1/2004 | Eidson et al. | |
| 6,753,734 B2 * | 6/2004 | Arell et al. | 330/296 |
| 6,763,228 B2 | 7/2004 | Prentice | |
| 6,771,128 B1 | 8/2004 | Yamashita et al. | |
| 6,819,182 B2 | 11/2004 | Sibrai | |
| 6,842,075 B2 * | 1/2005 | Johnson et al. | 330/296 |
| 6,873,208 B2 | 3/2005 | Shinjo et al. | |
| 6,873,211 B1 | 3/2005 | Thompson et al. | |
| 6,996,191 B1 | 2/2006 | Meditz | |
| 7,288,992 B2 * | 10/2007 | Birkbeck | 330/296 |
| 2004/0142674 A1 | 7/2004 | Kuiri | |

FOREIGN PATENT DOCUMENTS

| | | |
|---|---|---|
| EP | 0624004 | 11/1994 |
| EP | 0800267 | 8/1997 |
| GB | 2235855 | 3/1991 |
| JP | 57069939 | 4/1982 |
| WO | WO 96 17431 | 6/1996 |
| WO | WO 02/078170 | 10/2002 |

OTHER PUBLICATIONS

"Working Both Ways", Electronics & Wireless World, Dec. 1986 No. 1610, 1 page.

Engineering Notes, Power RF Amplifiers Technical Reference Material; "Load VSWR & Protection"; Date Unknown (located on the internet); www.rf-amplifiers.com/idex.php?topic=load_protection.

Lee, James G.; "The Effects of VSWR on Transmitted Power" Date Unknown (located on the internet); www.antennex.com/preview/vswr.htm.

* cited by examiner

AMPLIFIER FEEDBACK AND BIAS CONFIGURATION

FIELD OF THE INVENTION

The invention relates to amplifiers and in particular to an amplifier, having improved stability and accuracy, configured for use in a wireless communication device.

RELATED ART

Wireless communication devices have become popular in the United States, and throughout the world. For various reasons, numerous different communication standards have been adopted and implemented in not only the United States, but also, in different countries. Associated with a communication standard is usually a requirement that the wireless communication device transmit within a particular frequency range, usually referred to a frequency band. Signals transmitted outside of this assigned frequency band is highly undesirable and in violation of the standard and possibly one or more governmental regulations.

Maintaining operation within the desired frequency band is a challenge for wireless communications devices in general. While many different factors must be accounted for to maintain operation within the desired frequency band, one such factor that is particularly challenging arises from the changing impedance associated with the antenna of the wireless communication device. As is commonly understood, the input impedance of the antenna is dynamic and dependant on the environment of the wireless communication device. For example, if the antenna is touched by the user or set on a metal table or cabinet, the antenna's input impedance may change from input impedance when the antenna is in free space.

As can be appreciated, changes to an antenna's input impedance creates challenges for a wireless communication device's power or driver amplifiers due to reflection. In most instances, the amplifier's output impedance may be matched to the antenna's input impedance to maximize power transfer to the antenna and reduce reflection. When the antenna's input impedance dynamically changes, reflection of power from the antenna to the amplifier will dynamically occur.

Such reflection is particularly troublesome when the reflected wave creates an oscillation in the amplifier and is out of the operating frequency band of the amplifier. Oscillations may generate an electrical signal that is sufficiently powerful to cause an output of band transmission from the antenna in violation of the standard.

While various solutions to maintain stability and therefore prevent large out of band emissions have been proposed, these proposed solutions do not provide an adequate solution and are not desirable from a technical and business standpoint. One such proposed solution is to utilize a large capacitor in a feedback loop with the power amplifier. This solution is undesirable because if the capacitor is incorporated as an integrated element on an integrated circuit, then the capacitor would consume an undesirably large amount of space on the integrated circuit. Alternatively, the large capacitor could be provided as a separate discrete element, but due to cost and size concerns, it is much more desirable to integrate the entire circuit into a single die. Consequently, there is a need in the art for a stable power or driver amplifier configuration which is not adversely affected by signal reflections from an antenna. As described below, the method and apparatus as described and claimed herein provides a solution to the drawbacks of the prior art and also additional benefits.

SUMMARY

To overcome the drawbacks of the prior art and provide additional benefits, a wireless communication device amplifier is disclosed that is configured to reduce or eliminate out of band oscillations from voltage standing waves generated by antenna impedance mismatch reflection. This configuration is also effective in stablilizing the amplifier due to common leakage feedback found in all realizable designs. The amplifier is configured with an input, output, and biasing node configured to receive a biasing signal from a biasing amplifier. The biasing device draws current from the biasing node while providing the biasing voltage to the output amplifier. To adjust the magnitude and phase of the feedback over frequency, a frequency dependant network is provided in the feedback loop to selectively provide feedback to the output amplifier to prevent unwanted out of band oscillations. The frequency dependant network may comprise one or more resistors, inductors, and capacitors which are of small size and may be integrated.

In one embodiment, a method for reducing out of band oscillation from an amplifier in a wireless communication device is disclosed. This exemplary method of operation comprises biasing a power amplifier with a biasing circuit such that the biasing circuit comprises a device or circuit configured to sink current. This method of operation also receives an input signal at an amplifier input and then amplifies the input signal to create an amplified signal. The feedback loop selectively passes, on a frequency dependent basis, a portion of the amplified signal through amplifier feedback loop to the amplifier input such that a portion of the amplified signal provided to the amplifier input reduces out of band oscillation by providing more low frequency feedback than in previous solutions. By way of example, in one embodiment, more low frequency feedback may be provided than high frequency feedback.

In one embodiment the amplifier feedback loop comprises a resistor in parallel with a capacitor. It is contemplated that the amplifier feedback loop may further comprise an inductor in series with the resistor in parallel with the capacitor. In one scenario, the out of band oscillations are at a frequency lower than the operating frequency band of the wireless communication device. As is discussed herein, the bias circuit configured to sink current draws biasing current away from the amplifier to maintain desired biasing.

Also disclosed herein is an amplifier output stage for use in a wireless communication device. This amplifier comprises an output transistor having an output node, an input node, and a biasing node. Also part of the amplifier output stage is a feedback loop, associated with the output transistor, electronically connecting the output node and the biasing node. It is contemplated that the feedback loop may comprise any combination of parallel and/or series connections of passive components to achieve the desired feedback leading to a stable amplifier. Active elements may also be utilized. A biasing circuit, in conjunction with this feedback loop, is configured to sink current from the biasing node to thereby maintain bias of the output transistor, which is configured as an amplifier. The biasing circuit and feedback loop operate together to properly bias the amplifier while also providing the appropriate amount of feedback.

In one embodiment, the feedback loop further comprises an inductor. It is contemplated that the feedback loop is configured to provide feedback to the transistor, stabilizing the amplifier to eliminate out of band oscillations. The biasing amplifier that is configured to sink current may provide a biasing voltage to the biasing node while drawing current away from the biasing node. In addition, the output node may provide an amplified output signal to an antenna. As an advantage of this embodiment, the feedback loop comprises integrated elements.

In another embodiment, an amplifier is disclosed which is configured to provide an amplified output signal to an antenna node, which is connected to an antenna. The antenna is capable of creating an unwanted reflection signal which may comprise a low frequency, out of band oscillation signal. In this embodiment the amplifier comprises a first amplifier and a second amplifier. The first amplifier is configured to provide a biasing voltage to a biasing node and sink current from the biasing node to a ground node. The second amplifier is configured to amplify an input signal received at an input node and provide an amplified input signal to the antenna node such that the second amplifier is biased by a biasing signal on the biasing node. A feedback loop that electrically interconnects the input node and the antenna node is also provided. It comprises a frequency dependent divider network configured to pass low frequency, out of band signals to thereby reducing low frequency, out of band oscillation signals.

In one embodiment, the frequency dependent divider network comprises a resistor in parallel with capacitor. In one embodiment, the amplifier is configured to operate in the general frequency band of 900 MHz or 2 GHz. In contrast, the out of band oscillation may be in the frequency range of 20 MHz to 200 MHz. It is contemplated that the second amplifier may comprise an operational amplifier. Furthermore, the frequency dependent divider network may be configured as integrated elements in an integrated circuit.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

Figure 1:
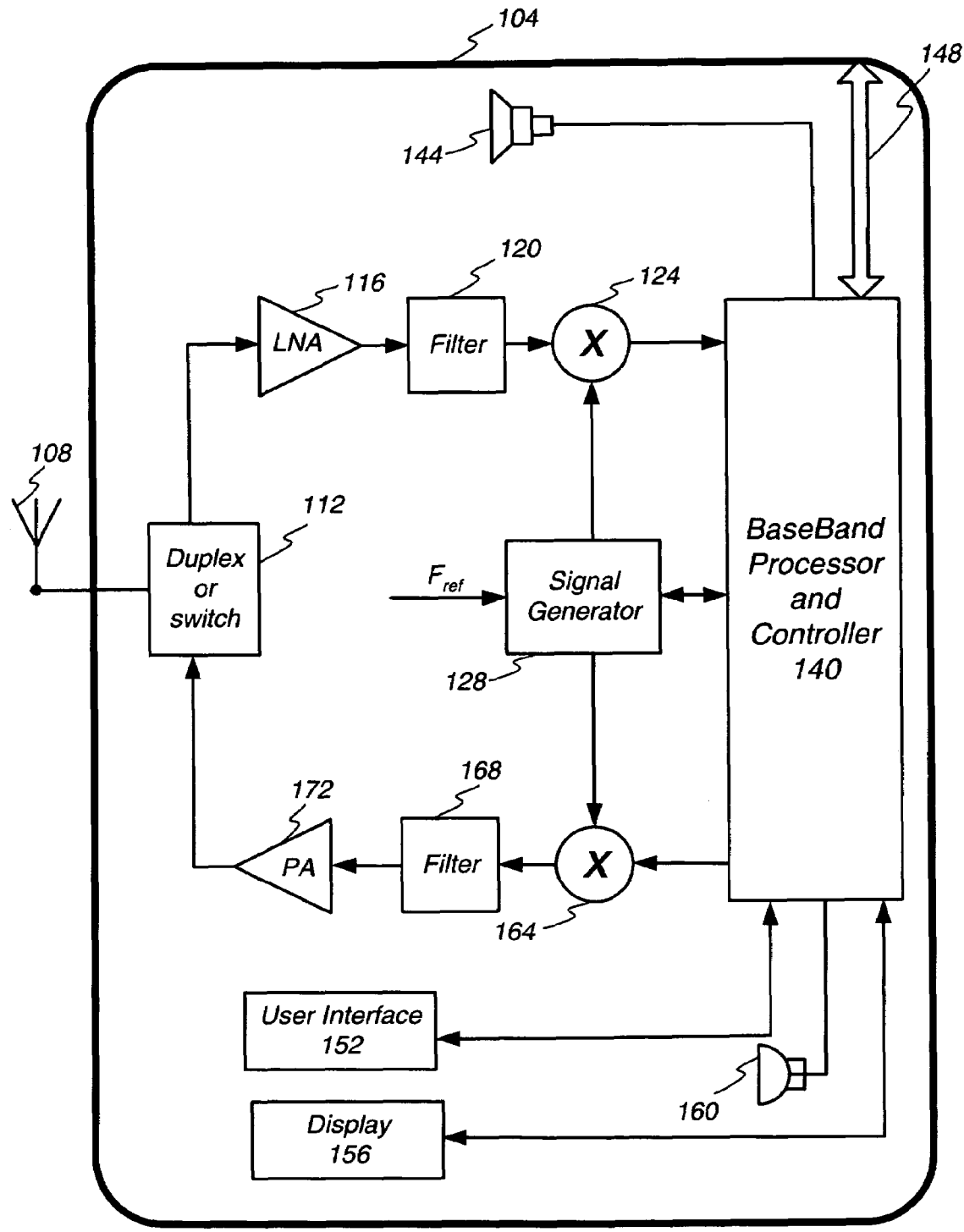
FIG. 1 illustrates a block diagram of example environment of use, namely a wireless communication device.

FIG. 1 illustrates a block diagram of a first example environment of use of the invention. The example environment shown in FIG. 1 comprises a wireless communication device but it is noted that this is but one of many possible example environments of use. It is contemplated that the invention may find use and provide benefit in numerous other environments both in the communication field and other fields of use.

The wireless communication device shown in FIG. 1 comprises an outer housing 104 configured to protect and selectively enclose the internal electronic apparatus. An antenna 108 receives incoming signals and transmits outgoing signals. The antenna 108 may be located inside or outside of the housing 104. A duplexer 112 connects to the antenna 108 to route incoming signals to a receiver apparatus, shown as the upper path from the duplexer 112 and route outgoing signals to the antenna.

The duplexer 112 connects to a receiver apparatus to thereby route received signals to a low noise amplifier (LNA) 116 that is configured to increase the signal power level for a particular frequency band to a level appropriate for processing by subsequent apparatus. The LNA 116 output connects to a filter 120 which may be configured to perform additional filtering or processing, such as for example band pass filtering or processing to mitigate the effects of the wireless channel.

After filtering, a mixer 124, also known as a down-converter, processes the received signal in conjunction with a signal from a signal generator 128. The mixer may be configured to extract a base band signal by multiplying the received signal at a carrier frequency with a signal from the signal generator that is also at the carrier frequency. As is well understood, the mixer 124 outputs the desired carrier signal.

The output from the mixer 124 feeds into a base band processor and controller 140 configured to receive and process the incoming base band signal. In one embodiment, the base band processor and controller 140 converts the incoming signal to a digital format, processes the digital signal, and then creates an analog signal which is provided to a speaker 144. Alternatively the digital signal may be provided directly to a data port 148. In this embodiment, the base band processor and controller 140 is in communication with the signal generator 128 to synchronize operation.

The base band processor and controller 140 is also configured to communicate data to and from a user interface 152, such as with one or more keys or buttons, and a display 156 configured to display text, graphics, or other information to a user.

To perform transmission of outgoing signals, the base band processor and controller 140 may receive a signal from a microphone 160 or digital data from the data port 148. Upon receipt of an outgoing signal, the base band processor and controller 140 processes the outgoing information to a base band signal and outputs this base band signal to a mixer 164, which may also be referred to as an up-converter. The mixer 164 multiplies the base band signal with an input from the signal generator 128 at the desired carrier frequency. The resulting outgoing signal comprises the base band signal modulated to the carrier frequency and is ready for filtering and processing by the filter 168 and then amplification by a power amplifier 172 to a power level suitable for transmission by the antenna 108 after passing through the duplexer 112.

Figure 2:
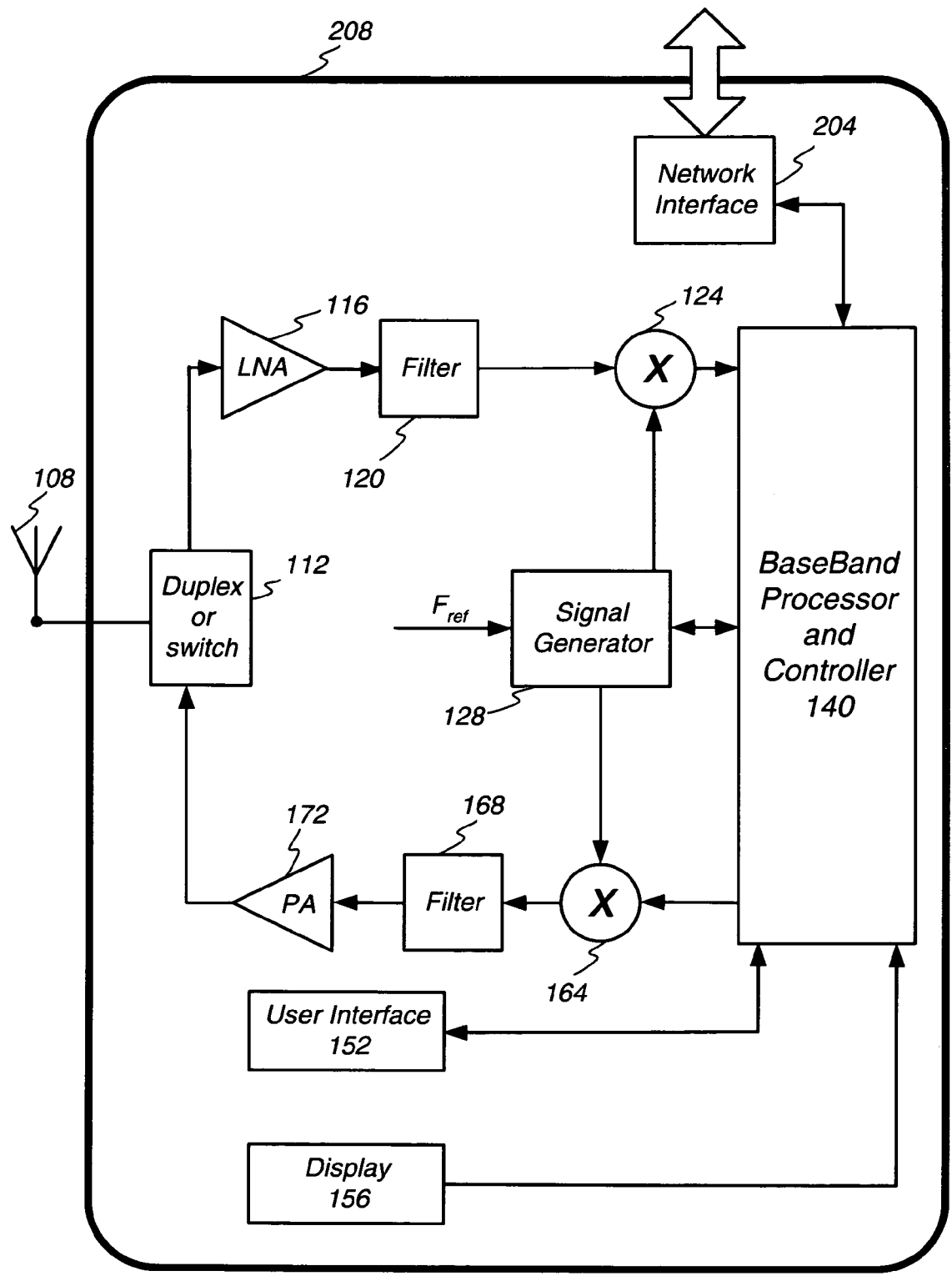
FIG. 2 illustrates a block diagram of example environment of use, namely, a base station.

FIG. 2 illustrates a block diagram of a second example environment of use of the invention. FIG. 2 shares numerous similarities with FIG. 1 and thus, wherein the aspects that differ from FIG. 1 are discussed in detail. The embodiment of FIG. 2 is directed to a base station 208 or non-mobile communication device configured to communicate with one or more other communication devices. In this configuration, which may represent a base station communication system 208, the base band processor and controller 140 communicate with a network interface 204. The network interface 204 may be configured to receive one or more signals or packet-based-data from the processor and controller 140. The one or more signals or packet-based-data is output to a computer network, internet, PSTN, or other medium that interfaces with a telephone network, data network, or cellular communication system. When configured as a base station 208, the system shown in FIG. 2 facilitates completion of a mobile telephone call, such as a telephone call from a cell phone or to a land line. These calls are often completed via the network interface 204 of the base station 208.

Figure 3:
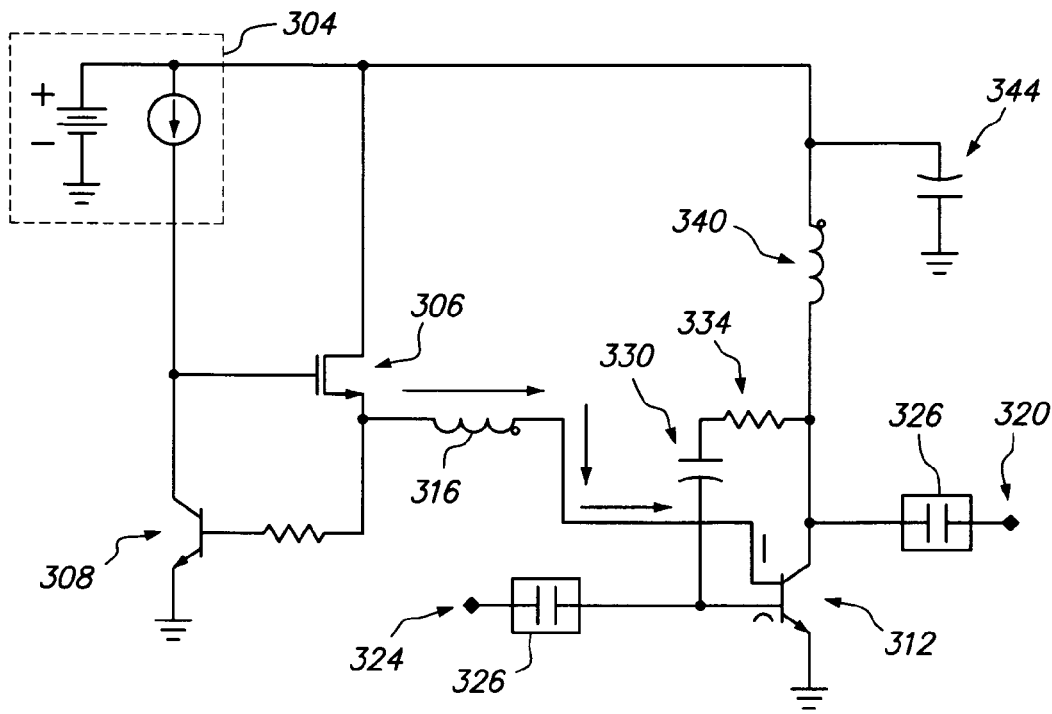
FIG. 3 illustrates a simplified circuit diagram of a prior art amplifier.

FIG. 3 illustrates a prior art amplifier which suffers from the drawbacks described above. As would be understood this circuit diagram is a simplified version that is useful for modeling and for purposes of discussion herein. One of ordinary skill in the art will appreciate that the circuits shown herein may require a different configuration when enabled in a wireless communication device. Moreover, to aid in understanding only the relevant aspects of the circuit are described and discussed in detail herein.

In FIG. 3, a power source 304 is shown to provide power to the amplifier and to establish biasing as discussed below. A transistor 306 connects to the power source as shown and is configured to establish a biasing current through an inductor 316 and to a transistor 312. In this configuration a transistor 308 and the transistor 312 are configured as a current mirror and selected to mirror the current in transistor 308 by the designed ratio of the current mirror. The output signal is provided on an output 320.

In this embodiment the bias current flows through the inductor 316 to transistor 312. The transistor 312 also receives an input signal on an input 324. Appropriate DC blocking capacitors 326 are provided on the input and output as shown. During operation, a signal provided on the input 324 is amplified by the transistor 312 and provided on the output 320. The output 320 may connect, either directly or indirectly to an antenna (not shown in FIG. 3). Power amplification is at a level sufficient to drive the antenna to radiate the signal to a receiving unit or base station depending on the environment of use.

The amplifier shown in FIG. 3 is terminated using an inductor 340 and a capacitor 344 to ground. This provides a path from the output of the transistor 312 to ground to thereby terminate unwanted energy to ground. In this configuration, if the capacitor 344 is selected to be large capacitance, then any low frequency oscillation will flow through capacitor 344 to ground. This however, requires an undesirably large capacitor 344, such that for low frequencies the capacitor will appear as a low resistance.

A feedback loop comprising a capacitor 330 and a resistor 334 connect to the input of the transistor 312 and the output node of the transistor 312 as shown. This feedback loop provides stability. By selecting the appropriate capacitor value, feedback will be provided through the feedback loop to maintain stability at low frequency. However, to establish the right level of feedback requires an undesirably large value capacitor 330.

For example, if the capacitor 330 was selected at 5 pf for a wireless device configured for a frequency band of 900 MHz or 2 GHz, the effective impedance would be a few tens of ohms. If however, a low frequency oscillation, such as at 10 MHz, was present at the input to the transistor 312, the capacitor 330 would appear as an impedance of approximately 3000 or more ohms. Such a large resistance in the feedback loop prevents feedback current flow thereby eliminating stability providing feedback, i.e. a feedback cancellation signal. As a result, a large value capacitor 330 is utilized to allow for feedback at low frequencies. Although maintaining the desired feedback level, such large capacitor values require undesirable physically large capacitors which are not feasibly integrated and hence must be undesirably located as a discrete off chip element.

As discussed above, the antenna's input impedance may dynamically change and hence not be matched to the output impedance of the amplifier output 320. Hence a reflection from the antenna back into the output 320 may occur due to this mismatch. This is undesirable because the reflection may generate an oscillation that finds its way back to the input 324 or bias input to the transistor 312.

By way of example and not limitation, for a wireless communication device operating in the 900 MHz or 2 GHz frequency band, when this oscillation is out of band, such as in the frequency range of 10 MHz to 100 MHz, and if this oscillation appears on the input, then the unwanted oscillation will transmit from the antenna. As a results, the prior art designs were relegated to using undesirably large capacitors to prevent such out of band transmissions.

Figure 4:
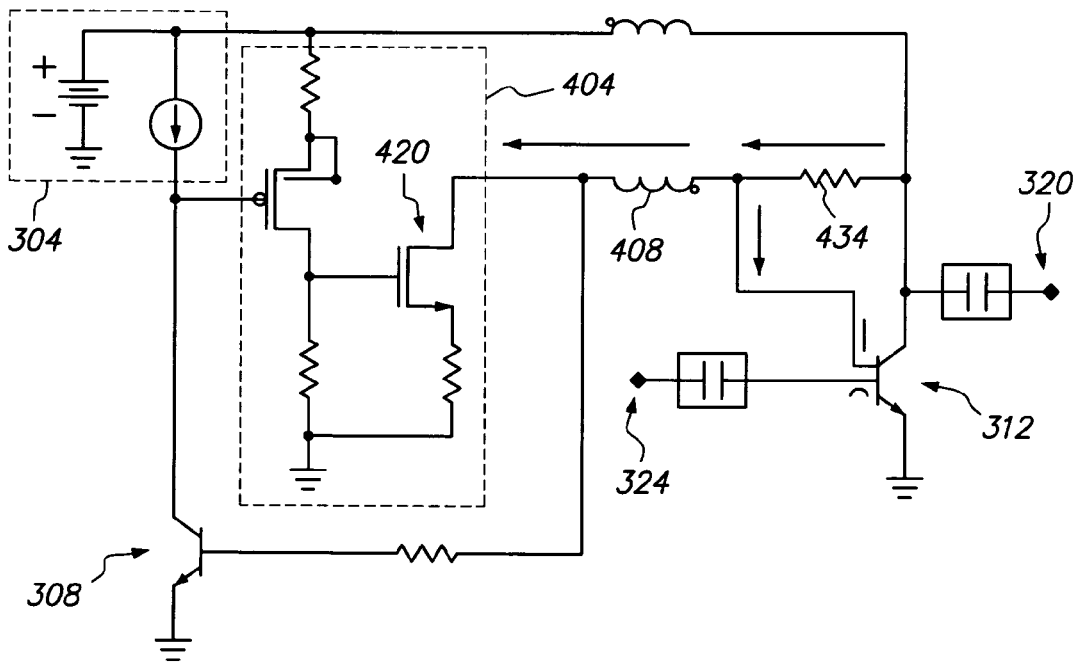
FIG. 4 illustrates a simplified circuit diagram of an amplifier configured with a biasing amplifier.

One solution is shown in the circuit configuration of FIG. 4. As compared to FIG. 3, only the elements that differ from that shown in FIG. 4 are discussed. The values of the elements shown in FIG. 4 or between different embodiments may differ. In this embodiment a bias circuit 404 that can sink current is shown inside the dash box 404. In particular, the bias circuit 404 includes a transistor 420 that is capable of sinking current out of the transistor 312 to control the bias and feedback into the transistor 312. Absent the inclusion of the transistor 420, the current through resistor 434 would aggressively turn on and potentially harm the transistor 312. An inductor 408 is located between the voltage amplifier 404 and the resistor 434 to act as a high frequency choke.

One challenge with this particular circuit topology is how to correctly bias the transistor 312. In this configuration, the resistor 434 is providing ample biasing current, some of which is sourced to the bias circuit 404 and through transistor 420 to ground. One drawback to this configuration is an undesirably large current consumption, due to the sinking of current through the transistor 420. Moreover, this configuration does not adequately cancel low frequency oscillation while also allowing high gain amplification at high frequencies.

Figure 5A:
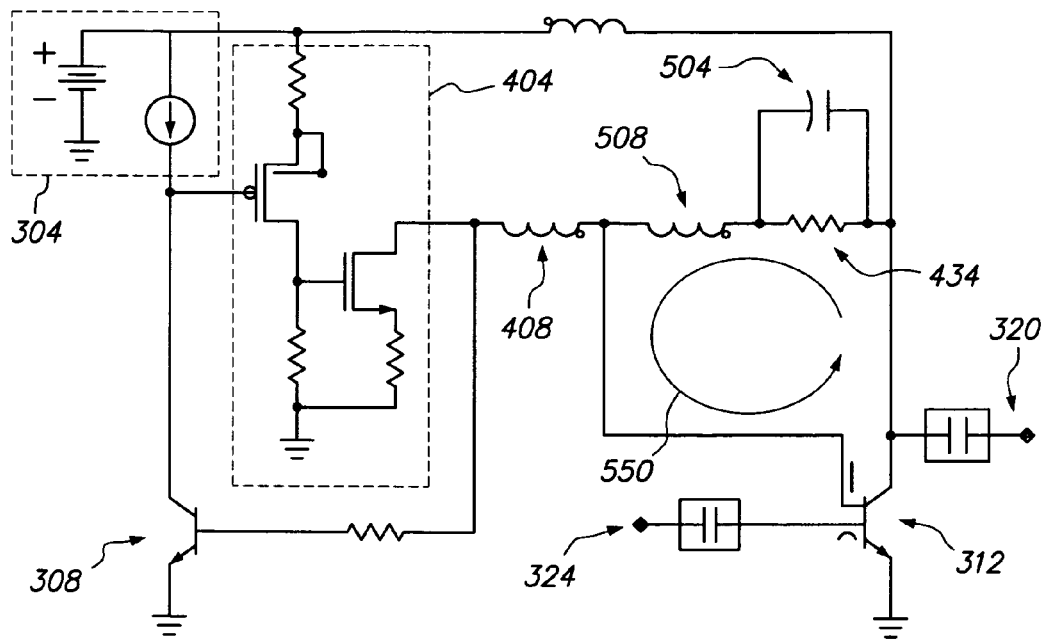
FIG. 5A illustrates a simplified circuit diagram of an amplifier configured with a biasing amplifier and a frequency dependent feedback loop.

FIG. 5A illustrates an example embodiment of another circuit which serves to overcome the drawbacks of the prior art. As compared to FIG. 4, common or similar elements are labeled with identical reference numbers. Further, it is contemplated that the values of the elements may be different between the different embodiments. In this embodiment a capacitor 504 is configured in parallel with the resistor 434. In addition, an inductor 508 is connected in series between the resistor 434 and the inductor 408 as shown.

In this configuration the capacitor 504 operates in conjunction with the resistor 434 to modify the resistance of the feedback loop, shown by feedback path 550. As can be appreciated, for low frequency signals, the impedance of the capacitor 504 will appear larger. This in turn causes the majority of the current through the resistor 434. Hence, at low frequencies, the impedance from the resistor 434 thus dominates the overall combination of the resistor 434 and capacitor 504.

Alternatively, for high frequency signals, the impedance of the capacitor 504 approaches zero, hence negating the effects of the resistor 434. As can be appreciated that is a desirable mode of operation in that for low frequency signals, such as out of band low frequency oscillations, feedback is provided through the resistor 434 through the small value capacitor 504, which will appears as a small impedance.

With regard to inductor 408, it behaves in a dynamic manner with regard to frequency to appear as an open circuit to high frequencies and a short to low frequencies. Hence, to a low frequency reflected signal, it appears as a short, thereby providing the desired feedback signal to maintain stability. To high frequency signals, it appears as a choke to prevent RF signals from entering the biasing aspects 404 of the circuit.

A small value capacitor 504 may be utilized in this embodiment and when selected in connection with the proper value of resistor 434 the low frequency feedback may be maximized while high frequency feedback is minimized. It is contemplated that one of ordinary skill in the art may appropriately select capacitor 504 and inductor 508 to tune the feedback path to achieve the desired frequency response which will provide feedback capable of canceling or reducing out of band oscillations. For example, at high frequencies, the capacitor 504 and inductor 508 may be selected to enable the transistor 312 into a high gain state. Likewise, for low frequencies signals, such as out of band oscillation, these values may be configured for zero gain level.

As a benefit to this configuration, the capacitor 504 and inductors 508, 408 may be enabled as integrated elements on or within the integrated circuit. These elements are small in size and do not consume an undesirably large amount of space. In addition, off chip capacitors may be avoided thereby reducing the cost and size of the entire circuit configuration.

The configuration shown in FIG. 5A is counter-intuitive because if configured with only the biasing circuit (amplifier with current sink capability), the circuit does not operation in an ideal manner. In particular, without the biasing circuit 404 the DC feedback will cause the device to DC saturate, thereby rendering the circuit inoperable. Likewise, with only the addition capacitor 504 and inductor 508, the circuit would become unstable. Through the combination of these two counterintuitive design elements, each of which individually yield undesirable results, a beneficial configuration is realized which overcomes the drawbacks of the prior art. In general, the configuration shown and described herein establishes amplifier stability at very low frequencies and does not require use of discrete components. Moreover, the loop gain improves the bias network impedance.

Figure 5B:
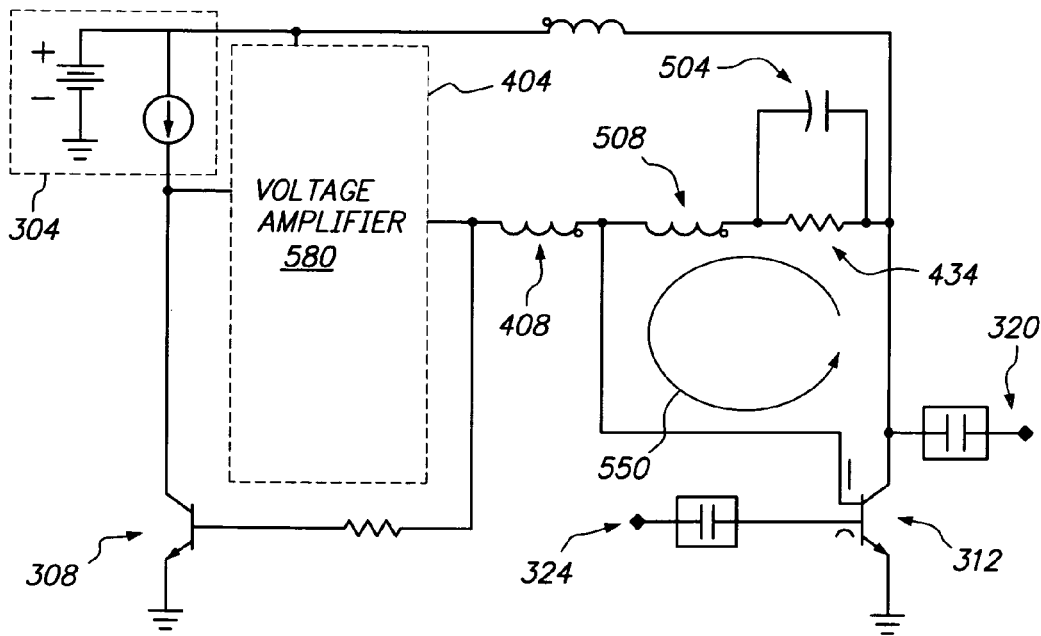
FIG. 5B illustrates an alternative embodiment of an amplifier configured with a biasing amplifier and a frequency dependent feedback loop.

FIG. 5B illustrates an alternative embodiment of the circuit shown in FIG. 5B. In this configuration, the voltage amplifier configured with current sink capability is shown generally as a voltage amplifier 580. In one embodiment the amplifier comprises an operational amplifier.

It is further contemplated that in any embodiment, variations in the type of amplifier or semiconductor device may adopted. One of ordinary skill in the will recognize that this invention is appropriate and capable of enablement with a common emitter or common source amplifier, using either an N-type or P-type, bipolar or a FET type transistor. In such a configuration it is contemplated that the biasing circuit may serve to regulate bias current and/or voltage to the amplifier. For example, the biasing circuit may source current, sink current, or a combination of both depending on the amplifier configuration.

While various embodiments of the invention have been described, it will be apparent to those of ordinary skill in the art that many more embodiments and implementations are possible that are within the scope of this invention. In addition, the various features, elements, and embodiments described herein may be claimed or combined in any combination or arrangement.

What is claimed is:

1. A method for reducing out of band oscillation from an amplifier in a wireless communication device, the method comprising:
   biasing a power amplifier with a biasing circuit, wherein the biasing circuit is configured to sink current;
   receiving an input signal at an amplifier input;
   amplifying the input signal to create an amplified signal;
   providing the amplified signal to an amplifier output and an amplifier feedback loop; and
   selectively passing a portion of the amplified output signal through the amplifier feedback loop to the amplifier input, wherein the portion of the amplified signal provided to the amplifier input reduces out of band oscillation.

2. The method of claim 1, wherein the amplifier feedback loop comprises a resistor in parallel with a capacitor.

3. The method of claim 1, wherein the feedback comprises low frequency feedback and high frequency feedback and more low frequency feedback is provided than high frequency feedback.

4. The method of claim 1, wherein the amplifier feedback loop comprises any combination of one or more resistors, one or more capacitors, or one or more inductors.

5. The method of claim 1, wherein the out of band oscillations comprise reflections from an antenna that are at a frequency lower than the operating frequency band of the wireless communication device.

6. The method of claim 1, wherein the bias circuit configured to sink current draws biasing current away from the amplifier to maintain desired biasing.

7. The method of claim 1, wherein the power amplifier comprises a common emitter or common source amplifier, using either an N-type or P-type, bipolar or FET type transistor.

8. An amplifier output stage for use in a wireless communication device comprising:
   an output amplifier having an output node, an input node, and a biasing node;
   a feedback loop, associated with the output amplifier, connecting the output node and the biasing node, wherein the feedback loop comprises a resistive network configured to pass feedback to the amplifier input node to prevent out of band oscillations; and
   a biasing network configured to sink current from the feedback loop away from the biasing node to thereby maintain bias of the output amplifier.

9. The amplifier output stage of claim 8, wherein the feedback loop comprises any combination of resistors, inductors, or capacitors.

10. The amplifier output stage of claim 8, wherein the amplifier comprises a common emitter or common source amplifier, using either an N-type or P-type, bipolar or FET type transistor.

11. The amplifier output stage of claim 8, wherein the feedback is frequency dependant.

12. The amplifier output stage of claim 8, wherein the feedback loop is configured to selectively pass a portion of the amplified output signal through the amplifier feedback loop to the amplifier input, wherein the portion of the amplified signal provided to the amplifier input reduces out of band oscillations.

13. The amplifier output stage of claim 8, wherein the biasing network is configured to sink current provides a biasing voltage to the biasing node while drawing feedback current away from the biasing node.

14. The amplifier output stage of claim 8, wherein the output node provides an amplified output signal to an antenna.

15. The amplifier output stage of claim 8, wherein the feedback loop comprises integrated elements.

16. An amplifier configured to provide an amplified output signal to an antenna node configured to connect to an antenna which is capable of creating a reflection signal which induces a low frequency, out of band oscillation signal, the amplifier comprising;
- a first bias circuit configured to provide a biasing voltage to a biasing node and sink current from the biasing node to a ground node;
- an amplifier configured to amplify an input signal received at an amplifier input node and provide an amplified input signal to an amplifier output node, which electrically connects to an antenna, wherein the amplifier is biased by the biasing voltage on the biasing node; and
- a feedback loop electrically interconnecting the amplifier input node and the amplifier output node and comprising a feedback network configured to feedback out of band signals to thereby cancel out of band oscillation signals which are generated by reflections from the antenna.

17. The amplifier of claim 16, wherein the feedback network comprises a resistor in parallel with a capacitor.

18. The amplifier of claim 16, wherein the amplifier is configured to operate in the band of 800 to 900 MHz or 1.7 to 2.1 GHz.

19. The amplifier of claim 16, wherein the bias circuit comprises an operational amplifier.

20. The amplifier of claim 16, wherein the feedback network is configured as only integrated elements in an integrated circuit.

21. The amplifier of claim 16, wherein the out of band oscillation is in the frequency range of 20 MHz to 200 MHz.

22. The amplifier of claim 16, wherein the amplifier is configured on a single die and the capacitance values are less than 100 picofarads.

23. The amplifier of claim 16, wherein the feedback network comprises a resistor.

24. The amplifier of claim 16, wherein the feedback is frequency dependant.

25. The amplifier of claim 16, wherein the amplifier comprises a common emitter or common source amplifier, using either an N-type or P-type, bipolar or FET type transistor.

* * * * *